(12) United States Patent
Wan et al.

(10) Patent No.: US 10,198,242 B2
(45) Date of Patent: Feb. 5, 2019

(54) METHOD AND APPARATUS FOR A VOLUME OF A DEVICE

(71) Applicant: MOTOROLA SOLUTIONS, INC, Chicago, IL (US)

(72) Inventors: Yong-Gang Wan, Plantation, FL (US); Hai-Qing Hu, Chengdu (CN); Xing Wei, Chengdu (CN)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/552,345

(22) PCT Filed: Apr. 14, 2015

(86) PCT No.: PCT/CN2015/076539
§ 371 (c)(1),
(2) Date: Aug. 21, 2017

(87) PCT Pub. No.: WO2016/165067
PCT Pub. Date: Oct. 20, 2016

(65) Prior Publication Data
US 2018/0074781 A1    Mar. 15, 2018

(51) Int. Cl.
*G06F 3/16*    (2006.01)
*H03G 3/02*    (2006.01)

(52) U.S. Cl.
CPC ............ *G06F 3/165* (2013.01); *H03G 3/02* (2013.01)

(58) Field of Classification Search
None
See application file for complete search history.

(56) References Cited

U.S. PATENT DOCUMENTS

| 4,221,006 A | 9/1980 | Weintraub et al. |
| 2004/0071294 A1* | 4/2004 | Halgas, Jr. .......... H04B 5/0006 381/59 |

(Continued)

FOREIGN PATENT DOCUMENTS

| CN | 202077166 U | 12/2011 |
| CN | 102355622 A | 2/2012 |

(Continued)

OTHER PUBLICATIONS

The International Search Report and the Written Opinion, corresponding patent application No. PCT/CN2015/076539 filed Apr. 14, 2015, all pages.

*Primary Examiner* — Curtis A Kuntz
*Assistant Examiner* — Qin Zhu
(74) *Attorney, Agent, or Firm* — Kenneth A. Haas; Barbara R. Doutre

(57) ABSTRACT

A method and apparatus for controlling a volume of a device is provided herein. During operation, a first device will receive a volume-adjustment message from a second device, along with an identity of an active application being run on the second device. The volume-adjustment message indicates whether or not the second device increased or decreased their volume. The first device will increase or decrease their volume in a similar manner as the second device if the first device is currently running a same active application as the second device; otherwise the first device will adjust its volume in an opposite direction as indicated in the volume-adjustment message.

15 Claims, 5 Drawing Sheets

(56) References Cited

U.S. PATENT DOCUMENTS

| | | | |
|---|---|---|---|
| 2009/0323987 A1 | 12/2009 | Yang et al. | |
| 2010/0157172 A1 | 6/2010 | Chen et al. | |
| 2014/0037107 A1 | 2/2014 | Marino, Jr. et al. | |
| 2014/0329567 A1 | 11/2014 | Chan et al. | |
| 2014/0363022 A1* | 12/2014 | Dizon | H03G 3/3005 |
| | | | 381/105 |
| 2016/0162015 A1* | 6/2016 | Moon | G06F 1/3287 |
| | | | 713/310 |
| 2016/0188287 A1* | 6/2016 | Sole | G06F 3/165 |
| | | | 381/77 |

FOREIGN PATENT DOCUMENTS

| | | |
|---|---|---|
| CN | 103377093 A | 10/2013 |
| CN | 103873906 A | 6/2014 |
| CN | 104484190 A | 4/2015 |

\* cited by examiner

METHOD AND APPARATUS FOR A VOLUME OF A DEVICE

FIELD OF THE INVENTION

The present invention generally relates to volume control, and more particularly to a method and apparatus for controlling the volume of a device located among multiple devices.

BACKGROUND OF THE INVENTION

In today's society, a user may have multiple electronic devices near them at any given time. For example, a user may be carrying a first smart phone associated with their place of work, and a second smart phone for their personal use. Oftentimes these electronic devices will output their sound in an unsynchronized manner such that the combines sound is inaudible to the user. For example, a user may be listening to a conference call on their work phone when their personal phone alerts them of an incoming call. Therefore, a need exists for a method and apparatus for controlling the volume of a device that alleviates the above-mentioned problem.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

Figure 1:
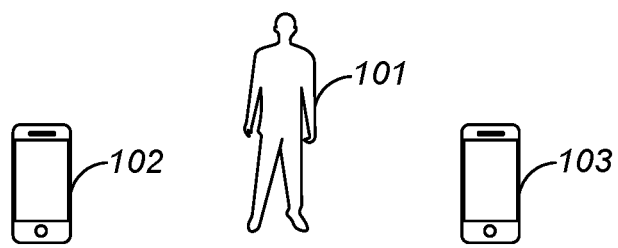
FIG. 1 illustrates an environment where multiple electronic devices are in use.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required.

DETAILED DESCRIPTION

In order to address the above mentioned need, a method and apparatus for controlling a volume of a device is provided herein. During operation, a first device will receive a volume-adjustment message from a second device, along with an identity of an active application being run on the second device. The volume-adjustment message indicates whether or not the second device increased or decreased their volume. The first device will increase or decrease their volume in a similar manner as the second device if the first device is currently running a same active application as the second device; otherwise the first device will adjust its volume in an opposite direction as indicated in the volume-adjustment message.

The above technique results in both devices adjusting their volume in unison (i.e., the same direction) when the active application run on both devices are the same, and adjusting their volume in opposite directions when the active application run on both devices is different. This will greatly reduce the chances that devices will audibly interfere with each other.

It should be noted that the term "active application" is meant to encompass two devices operating in a similar manner such that they are outputting the same audio. Thus, when two devices are outputting the same audio, their volumes will be controlled in unison. As an example of this, assume a police officer is carrying two radios. The "active application" may comprise a group call identifier. Therefore, when both radios are listening to the same group call, their volumes will be controlled in unison; otherwise their volumes will be controlled in an opposite direction.

In one embodiment of the present invention, devices will have their volume also increased or decreased based upon a distance between the two devices. For example, if the two devices are located far from each other, then the chances that their audio will interfere with each other is low. Therefore, the volume adjustment described above may take place only when the devices are located within a predetermined distance from each other (e.g., 8 meters).

In yet a further embodiment of the present invention, a scaling factor may be utilized so that any increase or decrease in volume of a device will be inversely proportional to a distance between the two devices. This results in large volume increases/decreases for devices that are close to each other, and small increases/decreases in volume for devices that are far from each other.

Prior to describing volume control in accordance with the preferred embodiment of the present invention the following definitions are provided to set the necessary background for utilization of the present invention.

Volume-control command—A command received by a device from a user, instructing the device to increase or decrease the volume to a speaker (e.g., a volume-up command, or a volume-down command). The volume-control command may be received by the user activating hard buttons, soft buttons, sliders, knobs, or any other user interface that controls a volume on a device.

Active Application—An identification of any software, hardware, or device configuration that is currently outputting a signal to a speaker. In other words, the active application indicates a source of audio being output by the speaker. The active application is used to uniquely identify the output of the device's speaker.

The active application may comprise, for example, an identification of music software, an identification of a particular song, an identification of an over-the-air air call, an identification of a talk group, . . . , etc.

Volume-adjustment message—A message transmitted and/or received by a device using an over-the-air protocol such as the Bluetooth protocol. The message is preferable a radio-frequency (RF) message. The message indicates an identification of a device that received a volume-control command, a direction in volume of the volume-control command (e.g., volume up, or volume down), an active application used by the device that received a volume-control command, and optionally, a location of the device that received a volume-control command.

FIG. 1 illustrates an environment where multiple electronic devices are in use. As shown in FIG. 1, user 101 is in possession of device 102 and device 103. Devices 102 and 103 may be similar devices (e.g., two cellular telephones), or may be different devices. Devices 102 and 103 may comprise any electronic device capable of outputting audio. Devices 102 and 103 may be stationary or portable devices. As an example, devices 102 and 103 may a standalone computer, a handheld computer, a tablet computer, a mobile phone, a smart phone, a police radio, a media player, a car stereo, a personal digital assistant (PDA), a GPS receiver, or the like, including a combination of two or more of these items.

Devices 102 and 103 preferably exchange information with each other via an RF connection. The exchange of information (data) with each other is preferably accomplished via a wireless transceiver (transmitter/receiver). In a preferred embodiment of the present invention the wireless transceiver operates using a short-range wireless communication protocol such as the 802.11 communication system protocol, or the Bluetooth communication system protocol. While any short-range and/or long range RF communication system protocol may be used to transfer data among devices 102 and 103, the description below will be provided with all devices utilizing a Bluetooth communication system protocol. The description below, however, is not meant to limit the protocol used between devices when exchanging data.

Bluetooth uses a method called bonding for recognizing specific devices and thus enabling control over which devices are allowed to connect to each other. Devices then can establish a connection without user intervention. A bond is created through a process called "pairing". The pairing process is typically triggered by a specific request to create a bond from a user via a user interface.

Pairing typically involves some level of user interaction. This user interaction is the basis for confirming the identity of devices. Once pairing successfully completes, a bond will have been formed between the two devices for data exchange, enabling those two devices to connect to each other in the future without again requiring the pairing process. When desired, the bonding relationship can later be removed by the user.

Figure 2:
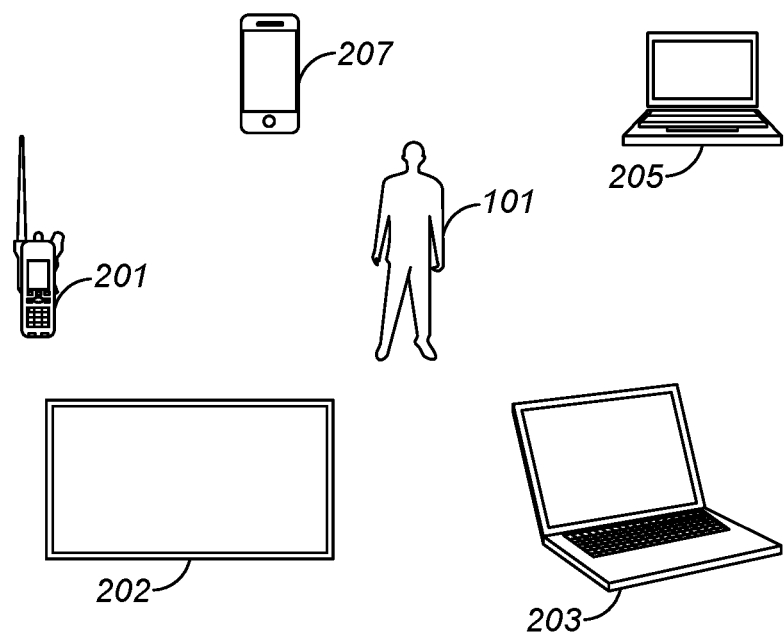
FIG. 2 illustrates an environment where multiple electronic devices are in use.

As shown in FIG. 2, there may be more than two devices within a predetermined distance from user 101. All devices will have their volume controlled in a similar manner. For example, all devices 201-207 will have their volume adjusted in unison if they are outputting a same audio, and will have their volume adjusted in an opposite direction if they are outputting different audio. More particularly, all devices will have their volume raised or lowered in unison if they have the same active application; otherwise their volume will be raised or lowered in an opposite direction. In order for all devices to receive and transmit data to all other devices, devices 201-207 will form a piconet for the transfer of data among devices.

Figure 3:
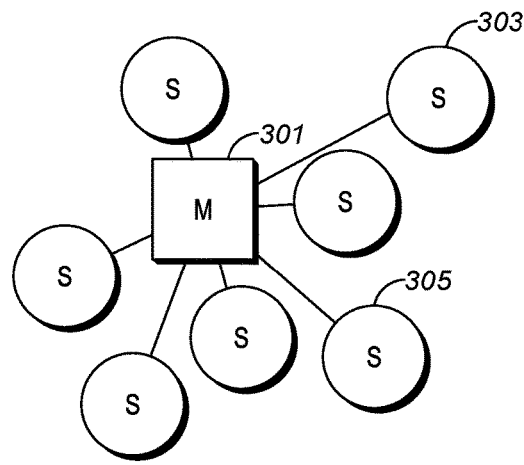
FIG. 3 personal area network set up among various electronic devices.

FIG. 3 illustrates a Bluetooth piconet formed among, for example, the devices shown in FIG. 2 for the exchange of data. Bluetooth networks (commonly referred to as piconets) use a master/slave model to control when and where devices can send data to each other via an active connection to the master via the piconet. In FIG. 3, master 301 is in communication with slave device 303 and slave device 305 along with the other slave devices (not numbered). In this model, master device 301 can be connected to up to seven different slave devices. Any slave device in the piconet can only be connected to a single master 301. Master 301 coordinates communication throughout the piconet. Master 301 can send/relay data to any of its slaves and request data from them as well. Thus, master and slaves can form a piconet to communicate data between each other as well as form a peer-to-peer connection with each other outside the piconet (i.e., not using the piconet). In the preferred embodiment of the present invention, the piconet comprises a Bluetooth piconet and the peer-to-peer connections among devices comprise standard Bluetooth connections, however in alternate embodiments of the present invention, any piconet (e.g., 802.11) or peer-to-peer communication system protocol may be used to form these connections.

Any device operating within the piconet shown in FIG. 3 may receive a volume up or volume down command (i.e., a volume control command) directly from user 101 by, for example, pressing a volume up or volume down button on the device. The volume on any device that received such a user input will be controlled as instructed by the user. In addition, the device will communicate the volume-control command to piconet master 301 along with an active application. The volume-control command and the active application will be transmitted to the piconet master in the form of a volume-adjustment message sown in FIG. 5. Piconet master 301 will then relay the volume-adjustment message to all other slave devices within the piconet. Master device 301 and all slave devices can then control their volume as discussed. Thus, all devices outputting the same sound as the device that received the volume adjustment command from the user will change their volume in unison. All devices that are not outputting the same sound as the device that received the command from the user will change their volume in an opposite direction.

Figure 4:
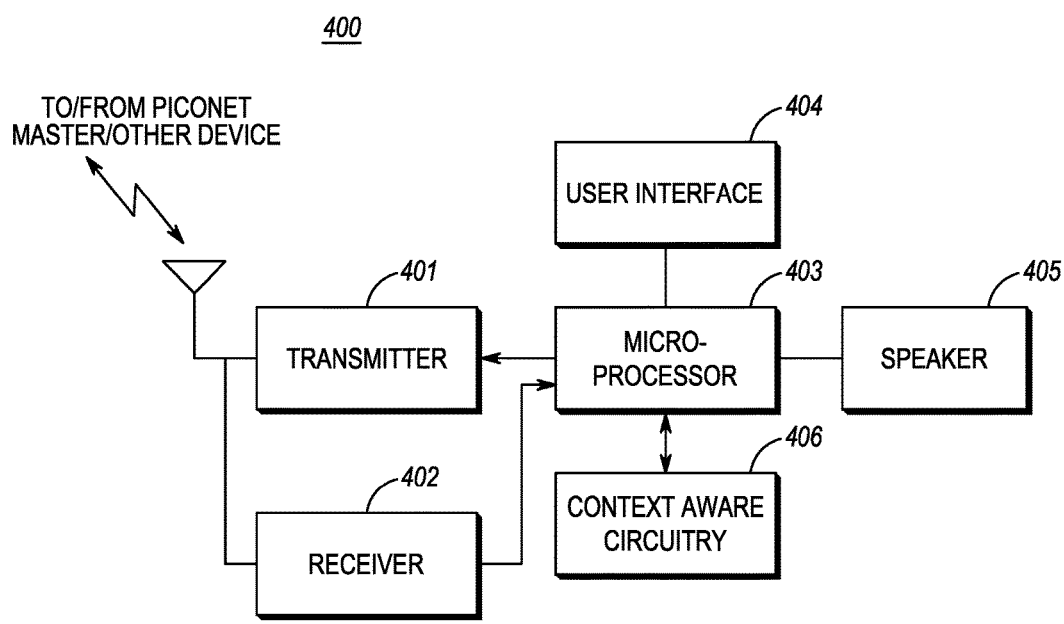
FIG. 4 is a block diagram of a device of FIG. 1 through FIG. 3.

FIG. 4 is a block diagram of a device of FIG. 1 through FIG. 3. As shown, device 400 may include transmitter 401, receiver 402, logic circuitry 403, user interface 404, speaker 405, and context-aware circuitry 406. In other implementations, device 400 may include more, fewer, or different components. For example, device 400 may comprise a memory and display.

Transmitter 401 and receiver 402 may be well known long-range and/or short-range transceivers that utilize, for example, a Bluetooth piconet, a private 802.11 network, or any other system protocol. Transmitter 401 and receiver 402 may also contain multiple transmitters and receivers, to support multiple communications protocols simultaneously.

Logic circuitry 403 comprises a digital signal processor (DSP), general purpose microprocessor, a programmable logic device, or application specific integrated circuit (ASIC) and is configured to receive a change in volume indication and control the volume of speaker 405 as discussed above. Logic circuitry 403 is also configured to create volume-adjustment messages upon the reception of a volume-control command. Logic circuitry 403 is also configured to make an appropriate volume adjustment based on a reception of a volume-control message.

User interface 404 preferably comprises circuitry to receive a volume-control command from a user (e.g., a volume up, or volume down control that controls a volume of speaker 405). User interface may comprise a simple knob that is turned to raise or lower a volume of a device, or may comprise buttons, sliders, etc. to raise/lower volume. Additionally, interface 404 may comprise a graphical user interface with soft buttons/sliders/keys used to control a volume of speaker 405.

Speaker 405 converts an electrical signal generated from an active application to human-audible sound waves.

Context-aware circuitry 406 may comprise any circuitry capable of generating a current context. For example, context-aware circuitry 406 may comprise a combination of a GPS receiver capable of determining a geographic location of device 400, or may comprise a signal-strength detector to detect current signal strength of any received signal from a piconet device.

When user interface 404 receives a volume-control command (i.e., volume up or volume down command), microprocessor 403 will instruct speaker 405 to adjust its volume accordingly. In addition, microprocessor 403 will instruct transmitter 401 to transmit a volume-adjustment message to other devices. The volume-adjustment message will comprise a volume-control command executed by device 400, along with an active application.

When receivers 402 of other devices receive the volume-adjustment message, it will pass the received volume-adjustment message to microprocessor 403. Microprocessor 403 will determine a volume-control command (i.e., volume up or volume down) along with a first active application embodied within the volume-adjustment message, and a second active application being run by device 400. If the active applications are similar, then microprocessor 403 will instruct speaker to change its volume in the same direction as indicated in the volume-adjustment message, otherwise microprocessor 403 will instruct speaker 405 to change its volume in an opposite direction to the direction indicated within the volume-adjustment message.

In a further embodiment of the present invention, context aware circuitry 406 will determine a distance between device 400 and the device sending the volume-adjustment message. If the distance is above a predetermined threshold, then no volume control of speaker 405 will take place. Volume adjustment may also take place in a magnitude that is inversely-proportional to a distance between devices.

In the simple case of two paired Bluetooth devices, context-aware circuitry 406 may simply comprise signal-strength circuitry, measuring signal strength of the received volume-adjustment message. If the signal strength is above a predetermined threshold, then it can be assumed that the devices are close together, and a volume adjustment may be made. If, however, the signal strength is not above the predetermined threshold, then it can be assumed that the devices are far apart, and no volume control adjustment to speaker 405 will be made.

In a more complicated case of multiple devices communicating via a piconet, the devices may use their actual geographic position to determined their proximity to each other. In this case, circuitry 406 may comprise GPS circuitry. The volume-adjustment message may indicate a geographic position of each device so that a determination can be made as to devices proximity.

Figure 5:
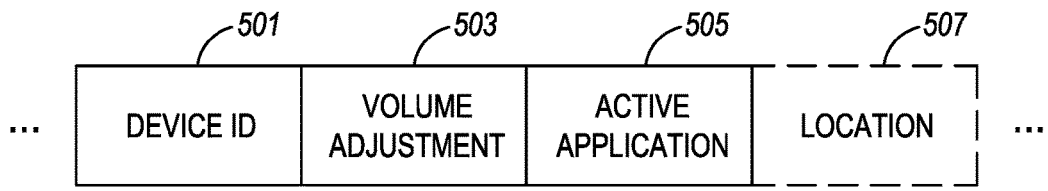
FIG. 5 is a block diagram of a volume-adjustment message.

FIG. 5 is a block diagram of a volume-adjustment message. As indicated above, this message is transmitted from transmitter 401 when a volume-control command is received by user interface 404. It should be noted that for ease of understanding, only certain payload information is shown in the volume-adjustment message of FIG. 5. The message of FIG. 5 is preferably transmitted using a Bluetooth communication system protocol, and comprises Device ID for the device receiving the volume-adjustment commend 501, a volume adjustment command 503 (e.g., volume up or volume down), an active application 505, and an optional location 507.

Figure 6:
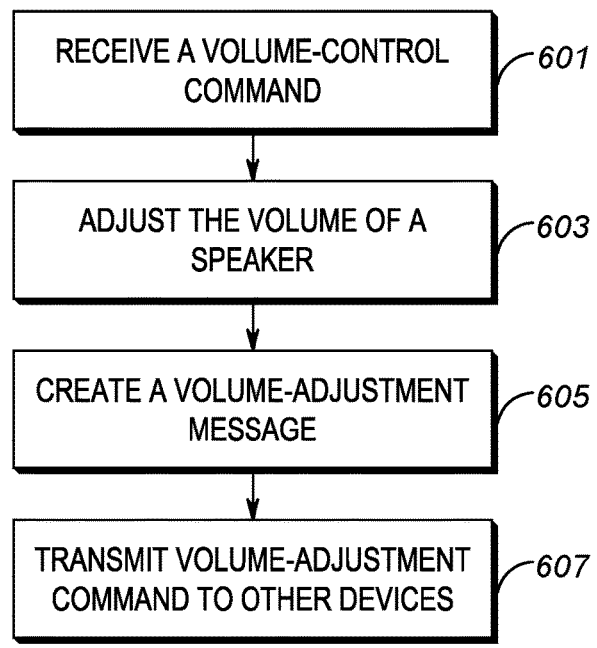
FIG. 6 is a flow chart showing operation of the device of FIG. 4 in accordance with a second embodiment of the present invention.

FIG. 6 is a flow chart showing operation of the device of FIG. 4 in accordance with a first embodiment of the present invention. More particularly, the logic flow of FIG. 6 illustrates those steps (not all necessary) taken by device 400 when a volume-control command is received by interface 404. The logic flow of begins at step 601 where user interface 404 receives a volume-control command. The volume control command may comprise either a volume-up command, or a volume-down command, and is used to control the volume of speaker 405. At step 603, user interface 404 passes the volume-control command to logic circuitry 403, where logic circuitry uses the command to adjust the volume of speaker 405 accordingly.

The logic flow continues to step 605 where logic circuitry creates a volume-adjustment message and passes the message to transmitter 401, and transmitter 401 transmits the volume-adjustment message to other nearby devices via an over-the-air communication system protocol (step 607).

It should be noted that in embodiments where a location of device 400 is being utilized to determine whether or not to increase or decrease a volume, logic circuitry 403 may utilize context-aware circuitry 406 to determine a current location, and embed the current location within the volume-adjustment message.

The logic flow of FIG. 6 results in a method for controlling a volume of a speaker within a device. The method comprises the steps of receiving a volume-control command, adjusting a volume to the speaker based on the volume-control command, creating a volume-adjustment message comprising the volume-control command and an active application, wherein the active application indicates a source of audio being output by the speaker, and transmitting, via an RF transmitter, the volume-adjustment message to other devices.

As discussed above, the volume-control command may comprise a volume-up command or a volume-down command, and be received from a knob, a soft key, a hard key, or a slider on the device. The transmission of the volume-adjustment message may take place over a Bluetooth piconet.

Figure 7:
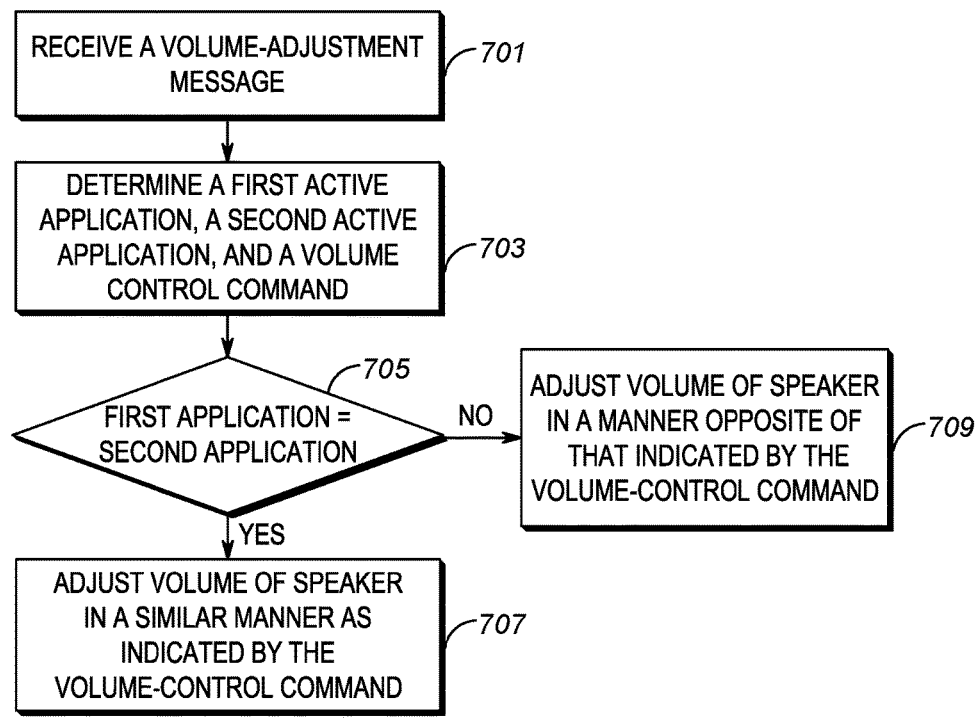
FIG. 7 is a flow chart showing operation of the device of FIG. 4 in accordance with a second embodiment of the present invention.

FIG. 7 is a flow chart showing operation of the device of FIG. 4 in accordance with a second embodiment of the present invention. More particularly, the logic flow of FIG. 7 shows those steps taken (not all necessary) by a first device 400 when receiving a volume-adjustment message from a second device. The logic flow begins at step 701 where receiver 402 receives a volume-adjustment message from the second device and passes the message to logic circuitry 403. In response, logic circuitry 403 determines a first active application (if any) being used by the first device, a volume-control command embodied within the volume-adjustment message, and a second active application being run by the second device and embodied within the volume-adjustment message (step 703).

The logic flow continues to step 705 where logic circuitry 403 determines if the first and the second active applications are similar. In other words, logic circuitry 403 determines if the first and the second device are outputting similar audio. If so, a volume of speaker 405 is adjusted in a similar manner to that indicated by the volume-control command 407, otherwise the volume of speaker 405 is adjusted in an opposite manner to that indicated by the volume-control command (step 709).

It should be noted that in embodiments where proximity of the first and the second device is being utilized to determine whether or not to increase or decrease a volume, logic circuitry 403 may utilize context-aware circuitry 406 to determine proximity of the first and the second device. A volume may only be adjusted if the devices are determined to be in close proximity (closer than a predetermined threshold).

The above logic flow results in a method comprising the steps of determining a first active application, wherein the first active application indicates a source of audio being output by a first speaker, receiving via an RF receiver, a volume-adjustment message, the volume-adjustment message comprising a volume-control command and a second active application, wherein the active application indicates a source of audio being output by a second speaker, determining if the first active application equals the second active application, and adjusting a volume to the first speaker in a manner opposite to that indicated in the volume adjustment message when the first active application does not equal the second active application, otherwise adjusting the volume to the speaker in a manner similar to that indicated in the volume adjustment message.

As discussed above, volume-control command may comprise a volume-up command or a volume-down command, and the volume-adjustment message may further comprise a location of the device. Additionally, the message may be received via a Bluetooth piconet.

Figure 8:
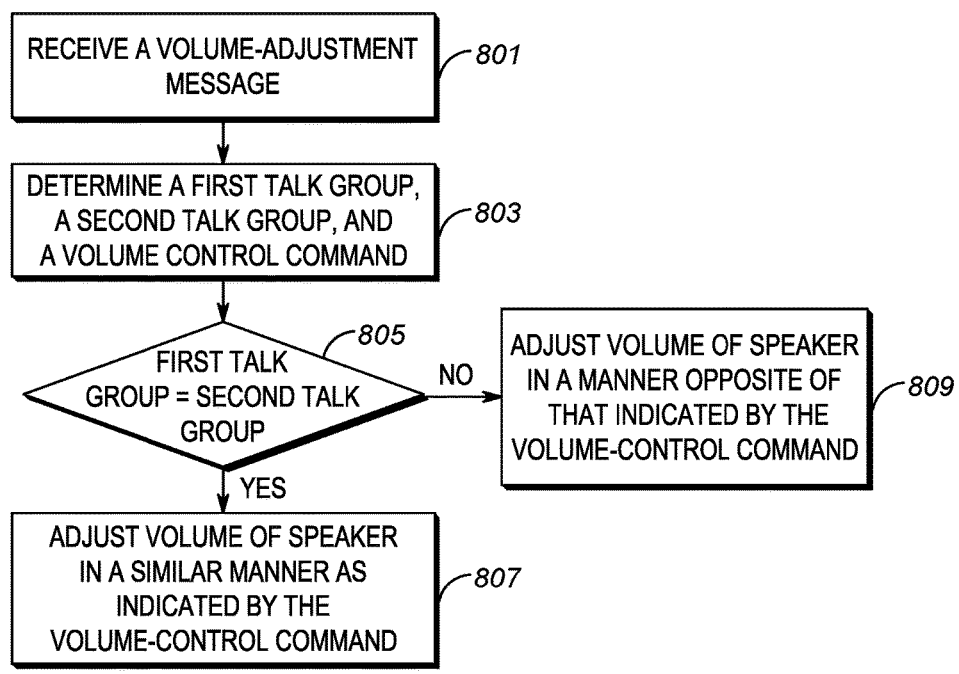
FIG. 8 is a flow chart showing operation of the device of FIG. 4 in accordance with a second embodiment of the present invention.

FIG. 8 is a flow chart showing operation of the device of FIG. 4 in accordance with a yet another embodiment of the present invention. More particularly this particular flow chart shows those steps (not all necessary) executed when device 400 is utilizing a talk-group as an "active application". More particularly, in a two-way radio system such as a public-safety radio system, each radio typically communicates with one group of radios (talk group) at a time. For example, a firefighter may be affiliated with or using one of several firefighter talk groups and a police officer may be affiliated with or using one of several police talk groups. Radios can also use Selective Squelch to listen their talk group without hearing others. Talk groups outside of those currently being listened to by a radio will not be heard by other radios or consoles. Thus, a radio speaker will only output audio from a talk group associated with the radio. When a user is in audible range of multiple radios, listening to multiple talk groups, the volume of the radios can be operated as described above, with a talk group identifier being used as the "active application".

The logic flow begins at step 801 where receiver 402 receives a volume-adjustment message and passes the message to logic circuitry 403. In response, logic circuitry 403 determines a first talk group embodied within the volume-adjustment message, a volume-control command embodied within the volume-adjustment message, and a second talk group (if any) being used by device 400.

The logic flow continues to step 805 where logic circuitry 403 determines if the first and the second talk groups are similar, and if so, a volume of speaker 405 is adjusted in a similar manner to that indicated by the volume-control command 407, otherwise the volume of speaker 405 is adjusted in an opposite manner to that indicated by the volume-control command (step 809)

In the foregoing specification, specific embodiments have been described. However, one of ordinary skill in the art appreciates that various modifications and changes can be made without departing from the scope of the invention as set forth in the claims below. For example, an "active application" was utilized above to determine if two devices are outputting the same audio. One of ordinary skill in the art will recognize that any metric may be used in place of the "active application" in order to determine if two devices are outputting the same audio. Accordingly, the specification and figures are to be regarded in an illustrative rather than a restrictive sense, and all such modifications are intended to be included within the scope of present teachings.

Those skilled in the art will further recognize that references to specific implementation embodiments such as "circuitry" may equally be accomplished via either on general purpose computing apparatus (e.g., CPU) or specialized processing apparatus (e.g., DSP) executing software instructions stored in non-transitory computer-readable memory. It will also be understood that the terms and expressions used herein have the ordinary technical meaning as is accorded to such terms and expressions by persons skilled in the technical field as set forth above except where different specific meanings have otherwise been set forth herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for controlling a volume of a speaker within a device, the method comprising the steps of:
   receiving a volume-control command;
   adjusting a volume to the speaker based on the volume-control command;
   creating a volume-adjustment message comprising the volume-control command and an active application, wherein the active application indicates a source of audio being output by the speaker;
   transmitting, via an RF transmitter, the volume-adjustment message to other devices to raise or lower the volume of the other devices when the other devices have the same active application, and otherwise adjusting the volume of the other devices in an opposite direction when the other devices are running different active applications.

2. The method of claim 1 wherein the step of receiving the volume-control command comprises the step of receiving the volume-control command from a knob, a soft key, a hard key, or a slider on the device.

3. The method of claim 1 wherein the volume-adjustment message further comprises a location of the device.

4. The method of claim 1 wherein the step of transmitting via the RF transmitter comprises the step of transmitting using a BLUETOOTH piconet.

5. The method of claim 1 wherein the active application comprises a talk group.

6. A method comprising the steps of:
   determining a first active application, wherein the first active application indicates a source of audio being output by a first speaker;
   receiving via an RF receiver, a volume-adjustment message, the volume-adjustment message comprising a volume-control command and a second active application, wherein the second active application indicates a source of audio being output by a second speaker;
   determining if the first active application equals the second active application; and
   adjusting a volume to the first speaker in a manner opposite to that indicated in the volume adjustment message when the first active application does not equal the second active application, otherwise adjusting the volume to the speaker in a manner similar to that indicated in the volume adjustment message.

7. The method of claim 6 wherein the volume-control command comprises a volume-up command or a volume-down command.

8. The method of claim 6 wherein the volume-adjustment message further comprises a location of the device.

9. The method of claim 6 wherein the step of receiving via the RF receiver comprises the step of receiving using a BLUETOOTH piconet.

10. The method of claim 6 wherein the active application comprises a talk group.

11. An apparatus for controlling a volume of a speaker within a device, the apparatus comprising:
    a user interface configured to receive a volume-control command;
    logic circuitry configured to adjust a volume to the speaker based on the volume-control command and to create a volume-adjustment message comprising the volume-control command and an active application, wherein the active application indicates a source of audio being output by the speaker; and
    a transmitter configured to transmit the volume-adjustment message to other devices to raise or lower the volume of the other devices when the other devices have the same active application, and otherwise adjusting the volume of the other devices in an opposite direction when the other devices are running different active applications.

12. The apparatus of claim 11 wherein the volume-control command comprises a volume-control command from a knob, a soft key, a hard key, or a slider on the device.

13. The apparatus of claim 11 wherein the volume-adjustment message further comprises a location of the device.

14. The method of claim 1, wherein the other devices will have their respective volumes increased or decreased based upon a distance between the device and the other devices.

15. The apparatus of claim 11, wherein the other devices will have their respective volumes increased or decreased based upon a distance between the device and the other devices.

* * * * *